US007773382B2

(12) United States Patent
Kingston et al.

(10) Patent No.: US 7,773,382 B2
(45) Date of Patent: Aug. 10, 2010

(54) SYSTEM AND METHOD FOR SUPPORTING ONE OR MORE HEAT-GENERATING ELECTRICAL DEVICES

(75) Inventors: Murray P. Kingston, Cambridge (CA); John C. Teeple, Brantford (CA); Mark W. Eady, Hamilton (CA); Bin Huang, Mississauga (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 247 days.

(21) Appl. No.: 11/843,277

(22) Filed: Aug. 22, 2007

(65) Prior Publication Data

US 2009/0052141 A1     Feb. 26, 2009

(51) Int. Cl.
*H05K 7/20* (2006.01)
(52) U.S. Cl. .................. 361/719; 361/704; 165/80.4; 257/718
(58) Field of Classification Search ............ 361/679.01, 361/679.46, 690, 694, 695, 692, 699, 700, 361/704, 719, 703, 748; 165/80.3, 185; 290/1 B; 257/685, 714, 718, 723, 733; 174/16.3
See application file for complete search history.

(56) References Cited

U.S. PATENT DOCUMENTS

| | | | | |
|---|---|---|---|---|
| 3,603,381 | A * | 9/1971 | Scherbaum et al. | 165/80.4 |
| 4,125,252 | A | 11/1978 | Jouanny | |
| 6,239,502 | B1 * | 5/2001 | Grewe et al. | 290/1 B |
| 6,430,052 | B1 * | 8/2002 | Kordes et al. | 361/719 |
| 6,532,154 | B2 | 3/2003 | Eady et al. | |
| 6,545,352 | B1 * | 4/2003 | Ruckdeschel | 257/718 |
| 6,728,104 | B1 * | 4/2004 | Ahmad et al. | 361/704 |
| 6,856,511 | B1 * | 2/2005 | Viernes et al. | 361/704 |
| 7,019,976 | B1 * | 3/2006 | Ahmad et al. | 361/704 |
| 7,064,957 | B1 * | 6/2006 | Liang et al. | 361/719 |
| 2004/0159936 | A1 * | 8/2004 | Ficorilli et al. | 257/720 |
| 2005/0146343 | A1 * | 7/2005 | Wright et al. | 324/760 |

OTHER PUBLICATIONS

Richco®—Barbed Push Fastener.
Recommendations regarding mechanical clamping of Press-pack High Power Semiconductors—Product Information, Bjorn Backlund, Toni Schweizer, ABB Switzerland Ltd, Semiconductors, Apr. 2004.

(Continued)

*Primary Examiner*—Jayprakash N Gandhi
*Assistant Examiner*—Courtney Smith
(74) *Attorney, Agent, or Firm*—Whyte Hirschboeck Dudek; Alexander R. Kuszewski; John M. Miller

(57) ABSTRACT

An apparatus and method for supporting a plurality of components, at least one of which is a heat-generating electrical device such as a power semiconductor device, are disclosed. In some embodiments, the apparatus includes a first structure having a first surface on one side of the structure configured for interfacing a first of the plurality of components and a second surface on another side of the structure, and also includes a second structure capable of receiving the first structure, where one of the second surface and an additional surface of the second structure includes a tip that is in contact with the other of those surfaces. The apparatus further includes at least one component configured to assist in retaining the first and second structures relative to one another, where notwithstanding the at least one component the first structure is capable of pivoting relative to the second structure about the tip.

26 Claims, 2 Drawing Sheets

OTHER PUBLICATIONS

Iconpower Limited, CP Clamp catalog, Sep. 2006.
PowerFlex™ 7000 Brochure.

Darrah Precision Clamps for Press Pack Power Semiconductors.

* cited by examiner

SYSTEM AND METHOD FOR SUPPORTING ONE OR MORE HEAT-GENERATING ELECTRICAL DEVICES

CROSS-REFERENCE TO RELATED APPLICATIONS

--

STATEMENT REGARDING FEDERALLY SPONSORED RESEARCH OR DEVELOPMENT

--

FIELD OF THE INVENTION

The present invention relates to systems and methods for supporting heat-generating electrical devices such as power semiconductor devices or other power electronics devices, and more particularly relates to systems and methods for supporting such heat-generating electrical devices in a manner that helps to achieve desired relative physical positioning of such devices so as to enhance and/or maximize heat dissipation away from those devices.

BACKGROUND OF THE INVENTION

Many electrical systems employ devices that generate significant amounts of heat such as, for example, power semiconductor devices or other power electronics devices. For example, many motor drives, reduced voltage soft starters and other machinery employ power semiconductor devices such as, further for example, diodes, silicon control rectifiers (SCRs), insulated gate bipolar transistors (IGBTs), integrated gate commutated thyristors (IGCTs), and symmetrical gate commutated thyristors (SGCTs). In many if not all such electrical systems it is desirable if not necessary that the heat generated by such devices be substantially dissipated away from those devices and out of the systems in a reliable, efficient manner.

In some systems employing multiple power semiconductor devices, the various power semiconductor devices are integral with respective printed circuit boards (PCBs) that are positioned successively adjacent to one another within a larger power cage housing or other support structure, with the power semiconductor devices themselves being positioned in line with one another and with heat sinks being positioned in between the neighboring power semiconductor devices so as to form a stack or "press pack" of such alternating power semiconductor devices and heat sinks. One exemplary system with such a stack is shown in, for example, U.S. Pat. No. 6,532,154 assigned to Rockwell Automation Technologies, Inc., the beneficial assignee of the present application, which is hereby incorporated by reference herein.

Typically, in order to attain the highest degree of heat dissipation from the power semiconductor devices of such a stack, the components within the stack need to be axially aligned along the entire length of the stack such that adjacent planar surfaces of the heat sinks and power semiconductor devices are in contact with one another as much as possible, and so that pressure is as evenly distributed along those interfacing surfaces as possible, so that heat can be effectively transferred from the power semiconductors to the heatsinks. However, such axial alignment can be difficult to perfectly attain because, when the different cards of the system on which the power semiconductor devices and heat sinks are mounted are inserted into a power cage housing or other support structure for those components, the resulting pressures engendered among the various structures/components can result in their slight deformation.

More particularly, assuming that in such a system the cards supporting the power semiconductor devices and heat sinks are inserted into the housing in the same manner as books are inserted into a book shelf (that is, from a front side of the housing toward a back side of the housing), there can be deformation of the housing from the front to the back. When such deformation occurs, the alignment among adjacent power semiconductor devices and heat sinks extending along the length of the book shelf becomes imperfect, such that there can be variations in the pressures experienced at different contact locations between such adjacent surfaces. As a result, the dissipation of heat from the power semiconductor devices can be reduced by 10-15% or even more. In some circumstances, such reduced heat dissipation capability can put stresses upon the power semiconductor devices and/or other components and reduce their useful lifespan(s).

For at least these reasons, therefore, it would be advantageous if an improved system and/or method were developed for supporting heat-generating electrical devices such as power semiconductor devices or other power electronics devices in a manner that enhanced and/or maximized heat dissipation from those devices. In at least some embodiments involving stacks of devices, such as power semiconductor devices and heat sinks, it would be further advantageous if such an improved system and/or method particularly achieved support for those devices in a manner that facilitated proper alignment of those devices such that the contact between interfacing surfaces of adjacent devices was maximized and/or contact pressure along those surfaces was rendered more even. Additionally, in at least some embodiments, it would be advantageous if the implementation of such an improved system and/or method did not entail large space requirements.

BRIEF SUMMARY OF THE INVENTION

The present inventors have recognized that misalignment of power semiconductor devices and associated heat sink devices within a stack can result in less effective heat dissipation away from the power semiconductor devices. Additionally, the present inventors have recognized that it is possible to achieve minor adjustments in the alignment of such components of a stack by making slight rotational shifts of a surface supporting the stack at one of its ends (or possibly surfaces at both ends of the stack). More particularly, the present inventors have recognized that, in at least some embodiments, it is possible to provide an end support surface that is pivotable about a point (e.g., a small surface approximating a point) with respect to the main body of the housing (or other support structure) on/within which the stack is being positioned. Given such a pivotable end support surface, minor misalignments of the components of the stack relative to the main body of the housing can be largely or entirely compensated for by way of corresponding movements of the end support surface, thus reducing the degree to which the adjacent interfacing surfaces of components of the stack fail to make contact and/or reducing the amount of pressure variation along such interfacing surfaces, and consequently enhancing the effective heat dissipation away from the power semiconductor devices relative to what it would otherwise be.

More particularly, in at least some embodiments, the present invention relates to an apparatus for supporting a plurality of components, at least one of which is a heat-generating electrical device. The apparatus includes a first structure having a first surface on a first side of the structure configured for interfacing a first of the plurality of components and a second surface on a second side of the structure generally opposite the first side. Additionally, the apparatus includes a second structure capable of receiving the first structure, wherein one of the second surface of the first structure and an additional surface of the second structure includes a tip that is in contact with the other of the second and additional surfaces. Further, the apparatus includes at least one component configured to assist in retaining the first structure in relation to the second structure, wherein notwithstanding the at least one component the first structure is capable of pivoting relative to the second structure about the tip.

Additionally, in at least some embodiments, the present invention relates to an assembly for use in supporting a stack including multiple power semiconductor devices. The assembly includes a wall structure, a disc capable of being positioned in proximity to the wall structure, where the disc has a first flat surface and a second conical surface respectively on substantially opposite sides of the disc, and means for retaining the disc in proximity to the wall structure. The disc is positioned with the second conical surface facing towards the wall structure such that the disc is capable of pivoting relative to the wall structure about an apex of the second conical surface.

Further, in at least some embodiments, the present invention relates to a method of supporting a stack of components including at least one heat-generating electronic device within a housing. The method includes providing a support structure having a primary, fixed portion and a secondary, movable portion, where the movable portion is pivotable relative to the fixed portion about a pivot location. The method additionally includes retaining the movable portion in proximity to the fixed portion. The method also includes allowing the movable portion to pivot relative to the fixed portion as the components are inserted into the housing so as to form the stack, so that a degree of contact between interfacing surfaces of at least two of the components of the stack is enhanced, whereby heat generated by the at least one heat-generating electronic device is more effectively dissipated than would otherwise have occurred.

DETAILED DESCRIPTION OF THE PREFERRED EMBODIMENT

Figure 1:
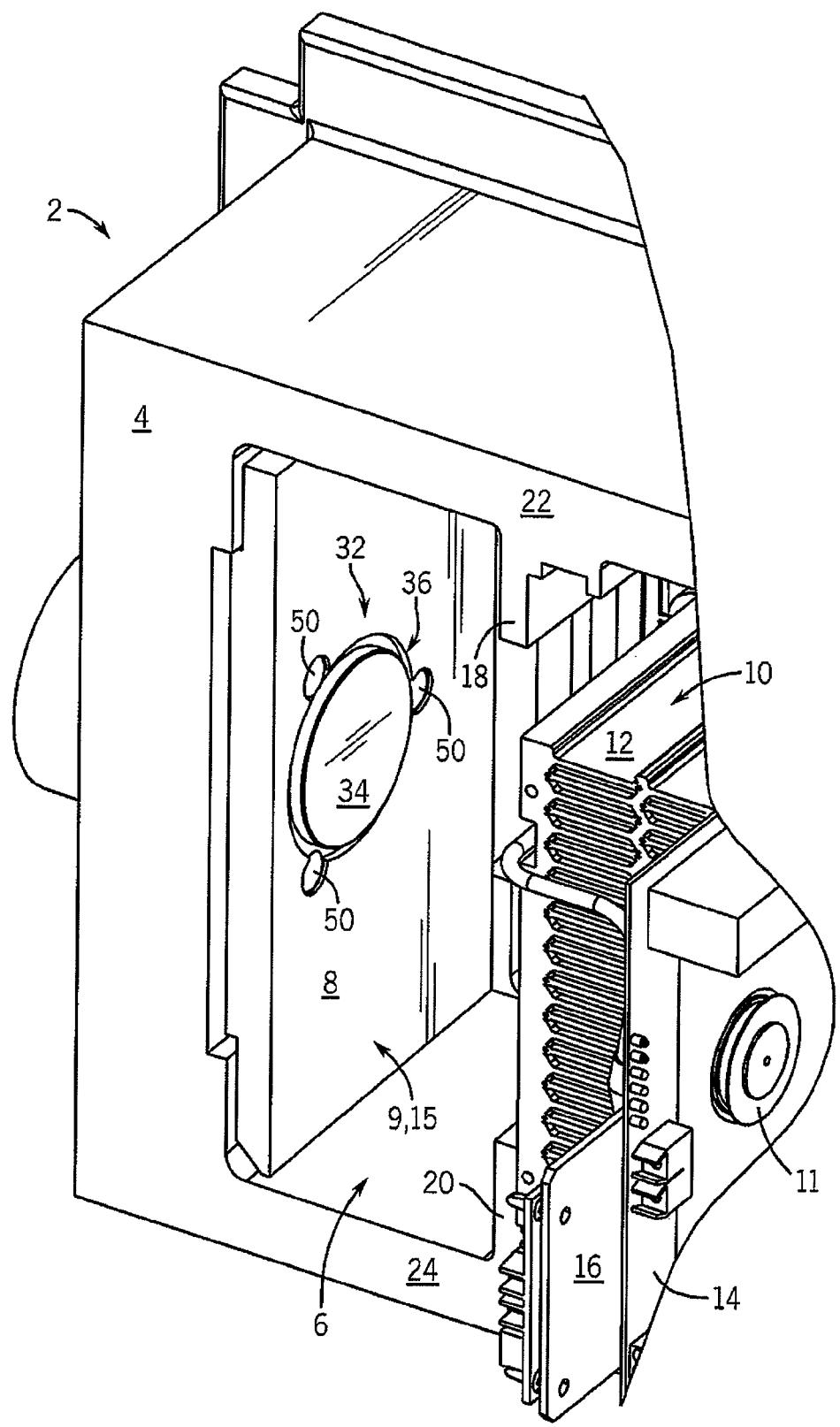
FIG. 1 is a perspective, cutaway view of an exemplary system having a housing capable of supporting multiple printed circuit boards along with multiple power semiconductors and heat sinks (only one of which is shown) that form a stack, where a portion of the housing includes an adjustable support structure intended to compensate for minor misalignments of the stack components, in accordance with at least some embodiments of the present invention.
Figure 2:
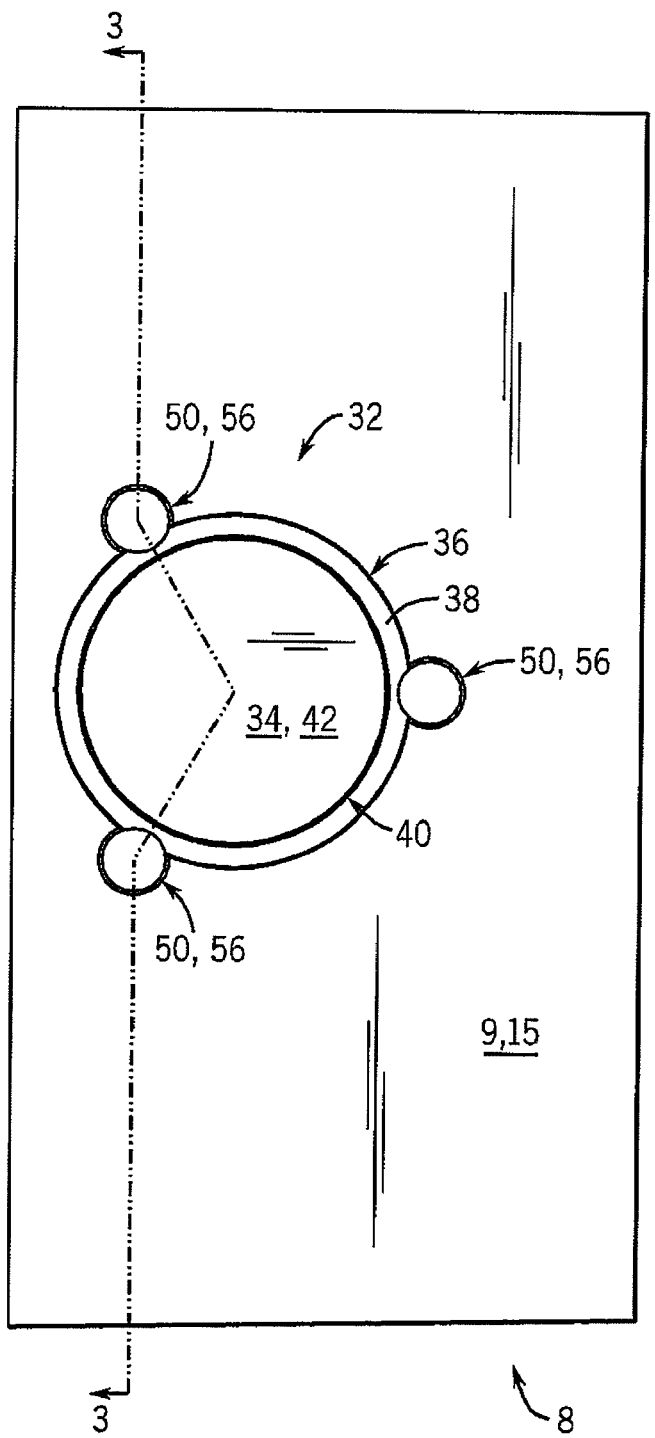
FIG. 2 is a side elevation view of the adjustable support structure of FIG. 1.
Figure 3:
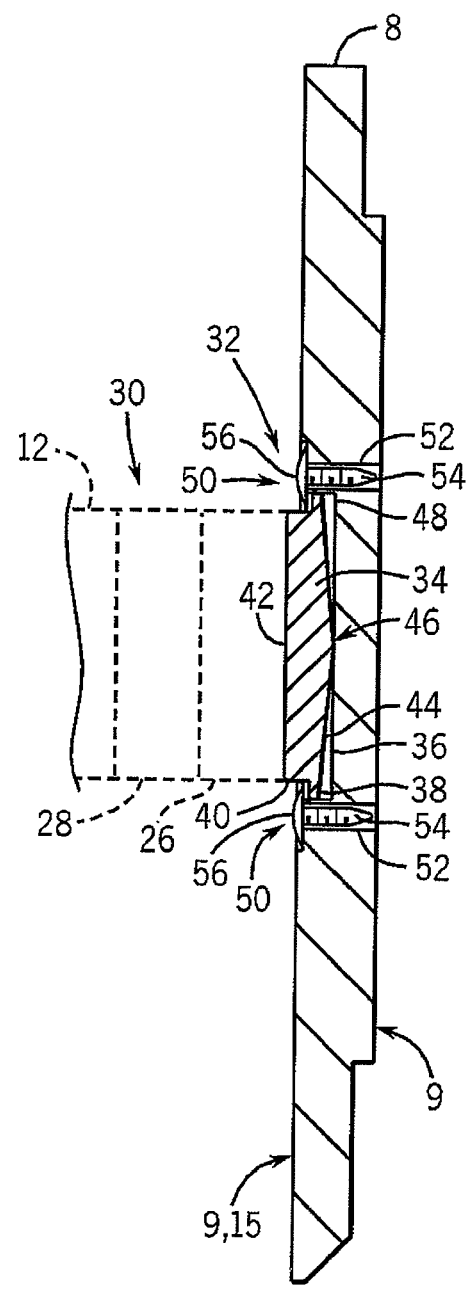
FIG. 3 is a cross-sectional view of the adjustable support structure of FIG. 2, taken along a line 3-3 of that figure, and additionally shows in phantom certain additional structures of the system of FIG. 1.

Referring to FIG. 1, a perspective, cutaway view is provided of components of an exemplary system 2 employing one embodiment of the present invention. The system can be, or be part of, any of a variety of devices/systems including, for example, motor drives, reduced voltage soft starters, and other machinery. More particularly, the system 2 is shown to include an outer power cage housing 4 that is substantially box-like and has a front orifice 6 into which numerous printed circuit board assemblies (PCB assemblies) can be inserted and supported relative to one another and relative to the housing. One such PCB assembly 10 is shown. Also in the present view of FIG. 1, the power cage housing 4 supports an end or base clamp plate 8 (in alternate embodiments, this plate can itself also be a PCB assembly). As will be discussed further below, FIG. 2 provides a side elevation view of the plate 8 and FIG. 3 provides a cross-sectional view of the plate taken along a line 3-3 of FIG. 2, and in addition shows in phantom certain additional exemplary structures of the system.

Further as shown, the PCB assembly 10 includes a heat sink 12 that is approximately three inches thick in the present embodiment, as well as a first PCB 14 and a second PCB 16 mounted alongside the heat sink 12. In the present embodiment, the first PCB 14 in particular is a gate driver PCB while the second PCB 16 is a temperature feedback PCB. The gate driver PCB 14 further supports a power semiconductor device 11, which in the present embodiment is a cylindrical disc or "hockey puck-shaped" structure having two substantially parallel circular sides and an outer perimeter cylindrical surface linking those two circular sides. Although not clearly shown in FIG. 1, it will be understood that the power semiconductor device 11 extends through the gate driver PCB 14 so that it is in contact with the heat sink 12. As mentioned above, such power semiconductor devices can take a variety of forms including, for example, diodes, silicon control rectifiers (SCRs), insulated gate bipolar transistors (IGBTs), integrated gate commutated thyristors (IGCTs), and symmetrical gate commutated thyristors (SGCTs).

Both the plate 8 and the PCB assembly 10 in the present embodiment are substantially rectangular structures shaped largely like books. The plate 8 in particular includes broad, substantially planar surfaces 9. Each of the plate 8 and the assembly 10 are inserted into the power cage housing 4 via the orifice 6 in a manner such that the structures are orientated substantially parallel to one another, similar to the manner in which books arranged on a book shelf are substantially parallel to one another. In will be further understood that the system 2 is partially disassembled, such that the PCB assembly 10 is shown to be not fully inserted into the power cage housing 4 and further such that another PCB assembly (not shown) can still be inserted in between the assembly 10 and the plate 8.

Each of the assembly 10 and other PCB assemblies (not shown) when inserted into the power cage housing 4 are supported upon respective pairs of support flanges 18, 20 extending downwardly and upwardly, respectively, from upper and lower portions 22, 24 of the power cage housing 4, respectively. The support flanges 18, 20 for supporting an additional PCB assembly in between the PCB assembly 10 and the plate 8 are shown in particular, although it will be understood that similar flanges exist for supporting the PCB assembly 10 and other PCB assemblies. In some alternate embodiments, the plate 8 also can be supported within the power cage housing 4 by way of a similar pair of the support flanges 18, 20.

When the system 2 is fully assembled, multiple PCB assemblies similar or identical to the PCB assembly 10 are inserted into and supported within the power cage housing 4. Each of the PCB assemblies includes a respective heat sink that is the same as or similar to the heat sink 12, as well as a respective power semiconductor device that is the same as or similar to the power semiconductor device 11, where the respective heat sink and respective power semiconductor device of each given PCB assembly are adjacent to one another. Additionally, the neighboring PCB assemblies are arranged side-by-side one another in sufficient proximity that, generally speaking, the power semiconductor device of each respective PCB assembly is wedged in between, and is in contact with, both the heat sink of its respective PCB assembly as well as the heat sink of the neighboring PCB assembly.

Given this arrangement, when the system 2 is fully assembled, an alternating stack of heat sinks and power semiconductor devices extends between the plate 8 at one end of the power cage housing 4 up to the opposite end of the power cage housing. At the ends of the stack, one of the heat sinks is in contact with the plate 8 at one end of the power cage housing 4, and one of the heat sinks at the opposite end of the stack is in contact with an alternate support (clamp head), at the opposite end of the power cage housing. FIG. 3 illustrates in phantom how one such stack 30 extends substantially from the plate 8 farther inward into the power cage housing 4 and includes, in that embodiment, a first heat sink 26 adjacent to a portion of the plate 8, the heat sink 12 of the PCB assembly 10, and a first power semiconductor device 28 positioned in between those heat sinks.

As shown in FIGS. 1-3, the plate 8 in the present embodiment includes a pivot point clamp 32 that provides support to one end of the stack 30. The pivot point clamp 32 includes a disc-shaped support structure (or pad) 34 that fits into a complementary circular recess 36 extending inwardly into a first of the surfaces 9 of a main wall portion 15 of the plate 8. In the present embodiment, both the pad 34 and the main wall portion 15 can be made from hardened steel, albeit in other embodiments these components can be made from other materials as well (e.g., hard plastic). As shown best in FIG. 3, the pad 34 is mushroom or top-hat-shaped insofar as it has an annular rim 38 that extends outward from a primary cylindrical surface 40 of the pad. When the pad 34 is inserted into the recess 36 within the main wall portion 15, the rim fits within the recess 36. That is, an outer diameter of the annular rim 38 is substantially equal to (albeit, slightly less than) an inner diameter of the recess 36.

Further as shown, the cylindrical outer surface 40 extends outward from the recess 36 up to a substantially planar, circular outer surface 42 of the pad, which forms the "top" of the top-hat shaped pad, and which is intended to interface an adjacent heat sink or power semiconductor device, for example, the heat sink 26 as shown. Opposite the surface 42 on the other side of the pad 34 (e.g., at the "base" of the top-hat shaped pad) is a shallow, cone-shaped surface 44, where the base of the cone-shaped surface is formed by the rim 38 and the cone extends inward into the recess 36 and away from the surface 42 until it reaches an apex or tip 46. When the system 2 is fully assembled, the circular outer surface 42 is (in the present embodiment) in contact with the stack 30 and more particularly, in the present example, is in contact with a complementary surface of the heat sink 26. Pressure exerted upon the surface 42 by the stack 30 is transmitted by the pad 34 to an inner surface 48 of the main portion 15 of the plate 8 by way of the tip 46, which is in contact with the surface 48. That is, all or substantially all of the pressure transmitted to the pad 34 by the stack 30 is borne by the tip 46 and thus transmitted to the main portion 15.

The inner surface 48 of the recess 36 in the present embodiment is circular and also is flat, unlike the cone shape of the surface 38. Consequently, the pad 34 is capable of wobbling about the tip 46 relative to the surface 48. That is, the pad is capable of rotating relative to the main portion 15 of the plate 8 about the intersection point of the tip 46 and the surface 48 in any rotational direction and, more particularly, any rotational direction about any axis that is aligned with the inner surface 48, up until the cone-shaped surface 44 encounters the surface 48 at one or more locations other than by way of the tip 46. It will further be noted that, in the present embodiment, a second of the surfaces 9 of the main portion 15 of the plate 8 (on the opposite side of the main portion relative to the first of those surfaces within which the recess 36 is formed), while substantially planar, includes step features proximate the lower and upper ends of the plate, to prevent backward installation of the plate 8 within the power cage housing 4.

Further shown in FIGS. 1-3, the pad 34 upon being inserted into the recess 36 is retained within that recess by way of, in the present embodiment, three push-in connectors 50 (only two of which are shown in FIG. 3). The push-in connectors 50 can be, for example, plastic, nylon-barbed push fasteners such as the Richco BPF-A414 connectors available from Richco Inc. of Morton Grove, Ill. Such push-in connectors 50 each have a respective enlarged head 56 and a respective shaft 54 attached to the head, where the shaft includes "fir-tree" features. When the shafts 54 of the push-in connectors 50 are respectively inserted into complementary threaded recesses 52 formed in the main portion 15 of the plate 8, the respective fir-tree features on the shafts grasp the threads of the respective recesses, thus locking the connectors in place relative to the main portion of the plate.

Additionally, when the push-in connectors 50 are attached to the main portion 15 of the plate 8, the enlarged heads 56 abut one of the surfaces 9, and portions of the heads overlap portions of the rim 38 of the pad 34, which is located within the recess 36. Because the push-in connectors 50 are spaced equidistantly around the circumference of the rim 38 of the pad 34 as shown best in FIG. 2 (where the connectors are each spaced substantially 120° apart from each of the other two connectors), the overlapping portions of the heads 56 prevent the rim 38 and thus the pad 34 from leaving the recess 36. Thus, while the pad 34 is capable of wobbling to some degree about the pivot point formed by the tip 46, the amount of wobbling that is allowed is potentially restricted by the heads 56 of the connectors 50, and in any event, the pad 34 overall is prevented from being removed from the recess 36 by the overlapping portions of the heads 56.

FIG. 3 shows an arrangement of the stack 30 and the end plate 8 in which the heat sinks and power semiconductor devices (e.g., the heat sinks 12, 26 and the power semiconductor device 28) of the stack 30 are aligned so that their interfacing surfaces are parallel to one another and to the surfaces 9 of the plate 8. Consequently, the pad 34 in supporting the stack 30 naturally takes a position in which the outer surface 42 likewise is parallel to the surfaces 9 of the plate. Given such an arrangement, effective heat dissipation from the power semiconductor devices occurs, assuming that the interfacing surfaces of the power semiconductor devices, the heat sinks and the pad are in contact along those entire surfaces (that is, there are not areas of poor contact between the interfacing surfaces) and assuming that the pressure experienced between any given pair of interfacing surfaces does not vary significantly as one moves along those surfaces.

Yet, notwithstanding the particular arrangement shown, the overall plate 8 including the pivot point clamp 32 is also capable of providing support to a stack such as the stack 30 that results in effective heat dissipation from that stack even when the heat sinks and/or power semiconductor devices are not (e.g., due to slight deformation of the power cage housing 4) so well aligned such that their interfacing surfaces are parallel to the surfaces 9. More particularly, because the pad 34 is capable of pivoting about the tip 46, the pad 34 is equally capable of providing support to the stack 30 even when the components of the stack are slightly misaligned. For example, if the alignment of the components of the stack 30 is off of perpendicular (e.g., perpendicular to the surfaces 9 of the plate) by ½ of a degree, the pad 34 will accordingly move ½ of a degree about its tip 46 with respect to the main portion 15 of the plate 8 and thereby accommodate such misalignment.

Thus, at least some embodiments of the present invention are capable of providing support for stacks of heat-generating electronic devices (and/or other devices) in a manner that facilitates proper alignment of those devices, such that the contact between interfacing surfaces of adjacent devices is maximized and/or contact pressure along those surfaces is rendered more even. Thus, enhanced levels of heat dissipation and cooling efficiency can be achieved relative to what could be achieved using conventional support structures/mechanisms. In particular, for embodiments in which a stack having multiple power semiconductor devices and heat sinks is being supported, enhanced levels of heat transfer between the interfacing power semiconductor devices and associated heat sinks can be achieved, thus resulting in enhanced levels of overall heat dissipation. Additionally, the enhanced heat dissipation from such devices and cooling of such devices can result in increased power efficiency and output power levels of those devices and any systems with which they are associated (e.g., medium voltage motor drives).

Further, embodiments of the present invention allow for even clamping pressure without loosening and retorquing of various power connections in a stack, and thus implementation of such embodiments is forgiving for personnel working on the stack and/or related equipment. Additionally, at least some embodiments of the present invention are capable of implementation without the need for components that occupy large amounts of space within the power cage housing or otherwise. Indeed, the embodiment of FIGS. 1-3 occupies the same space than would be occupied by a support that included only a flat end plate without any pad.

Notwithstanding the above description relating to FIGS. 1-3, the present invention is intended to encompass a variety of alternate embodiments as well. For example, while the PCB assembly 10 is shown to include the two PCBs 14, 16, in other embodiments less than one such PCB or more than two such PCBs can be provided. Additionally, in at least some embodiments, the number of push-in connectors can vary from three. Further for example, in at least some embodiments, a flange can be formed integrally with the main portion 15 of the plate 8 that helps to retain in place a pad such as the pad 34. In such embodiments, less than 3 (even only one or even none) connectors are necessary. Also, in other embodiments, the number of push-in connectors can be greater than three, for example, in embodiments in which the pad has a shape other than a circular shape as shown.

Depending upon the embodiment, other types of connectors or fastening devices/mechanisms can also be used. For example, in some embodiments, conventional screws other than the push-in connectors described above are employed. Further, the present invention is intended to be capable of being implemented in connection with power semiconductors devices that have a shape other than a hockey-puck-shape as described above. Indeed, the present invention is intended to be applicable to systems employing any of a variety of different heat-generating electronic components. Also, the interfacing surfaces between the components of the stack can be other than purely planar. Indeed, in some such embodiments, the surface 42 of the pad 34 (or such other pad) can take a form other than a planar form.

Additionally, while the present embodiment envisions use of the pivot point clamp 32 at one end of the power cage housing 4 (with a fixed wall being provided at the opposite end), in other embodiments it is possible that a second pivot point clamp can be provided at the opposite end of the power cage housing, such that such clamps are employed to support both ends of a stack. Further, in some alternate embodiments, the inner wall of the pad 34 need not have a tip such as the tip 46 that forms the pivoting point between the pad and the main portion of the plate. Rather, in some such embodiments, it is the main portion of the plate (e.g., the inner surface within the recess) that includes a tip-like feature allowing for pivoting, and the pad merely has an inner surface (e.g., a flat surface) that pivots around that tip-like feature.

It is specifically intended that the present invention not be limited to the embodiments and illustrations contained herein, but include modified forms of those embodiments including portions of the embodiments and combinations of elements of different embodiments as come within the scope of the following claims.

We claim:

1. An apparatus for supporting a plurality of components, at least one of which is a heat-generating electrical device, the apparatus comprising:
    a first structure having a first surface on a first side of the structure configured for interfacing a first of the plurality of components and a second surface on a second side of the structure generally opposite the first side;
    a second structure capable of receiving the first structure, wherein one of the second surface of the first structure and an additional surface of the second structure includes a tip that is in contact with the other of the second and additional surfaces; and
    at least one component configured to assist in retaining the first structure in relation to the second structure, wherein notwithstanding the at least one component the first structure is capable of tilting relative to the second structure about the tip, about an axis aligned with the other of the second and additional surfaces.

2. The apparatus of claim 1, wherein the first surface is a planar surface.

3. The apparatus of claim 1, wherein the second surface is a conical surface and includes the tip, which is an apex of the conical surface.

4. The apparatus of claim 1, wherein the first structure is substantially cylindrical.

5. The apparatus of claim 1, wherein the first structure includes an outer surface extending from the first surface toward the second surface, wherein the outer surface extends substantially around the first surface.

6. The apparatus of claim 5, wherein the outer surface extends from the first surface to a rim of the first structure, and wherein the rim extends outward further from the outer surface.

7. The apparatus of claim 6, wherein the at least one component is capable of contacting the rim depending upon the tilting position of the first structure and thereby assisting in retaining the first structure in relation to the second structure.

8. The apparatus of claim 1, wherein the at least one component includes a fastening component having a shaft and an enlarged head with a diameter greater than that of the shaft, wherein the second structure includes an orifice capable of receiving the shaft of the fastening component so that the fastening component is substantially retained relative to the second structure, and wherein the enlarged head of the fastening component extends over a portion of the first structure when the fastening component is implemented upon the second structure, whereby the fastening component assists in retaining the first structure relative to the second structure.

9. The apparatus of claim 1, wherein the at least one component includes three fastening components.

10. The apparatus of claim 9, wherein each of the three fastening components is selected from the group consisting of a push-in connector having a shaft and a plurality of projections along the shaft, and a screw.

11. The apparatus of claim 1, wherein the second structure includes a threaded hole and a first of the at least one component includes a shaft that extends into the threaded hole and is secured therewithin.

12. The apparatus of claim 1, wherein the at least one component includes a retaining formation that is integral with the second structure.

13. A system comprising the apparatus of claim 1 and further comprising the plurality of components.

14. The system of claim 13, wherein the plurality of components includes at least one power semiconductor device and at least one heat sink.

15. The system of claim 14, wherein the plurality of components includes a plurality of power semiconductor devices and a plurality of heat sinks that are alternatingly positioned in a stack.

16. A power cage comprising the system of claim 15, wherein the plurality of components within the stack are supported at least at a first end of the stack by the first surface of the first structure.

17. The power cage of claim 15, wherein the power semiconductor devices are selected from the group consisting of a diode, a SCR, an IGBT, an IGCT, and a SGCT.

18. An assembly for use in supporting a stack including multiple power semiconductor devices, the assembly comprising:
   a wall structure having a surface thereon;
   a disc capable of being positioned in proximity to the wall structure, wherein the disc has a first flat surface and a second conical surface respectively on substantially opposite sides of the disc; and
   means for retaining the disc in proximity to the wall structure,
   wherein the disc is positioned with the second conical surface facing towards the wall structure such that the disc is capable of tilting relative to the wall structure surface about an apex of the second conical surface about an axis aligned with the wall structure surface.

19. The assembly of claim 18, wherein the wall structure includes a recess formed therewithin, wherein the disc is positioned substantially within the recess, and wherein the means for retaining includes a fastening device that is connected to the wall structure and that includes an enlarged head that overlaps a portion of the disc and thereby provides assistance in retaining the disc in proximity to the wall structure.

20. A method of supporting a stack of components including at least one heat-generating electronic device within a housing, the method comprising:
   providing a support structure having a primary, fixed portion with a fixed portion surface thereon and a secondary, movable portion, wherein the movable portion is in contact with the fixed portion surface and is capable of tilting relative to the fixed portion surface about a tilt location, about an axis aligned with the fixed portion surface;
   retaining the movable portion in proximity to the fixed portion; and
   allowing the movable portion to tilt relative to the fixed portion surface as the components are inserted into the housing so as to form the stack, so that a degree of contact between interfacing surfaces of at least two of the components of the stack is enhanced,
   whereby heat generated by the at least one heat-generating electronic device is more effectively dissipated than would otherwise have occurred.

21. The method of claim 20, wherein the at least one heat-generating electronic device includes at least one power semiconductor device.

22. The apparatus of claim 1, wherein the second surface is directed away from the first surface.

23. The apparatus of claim 1, wherein the one of the second surface of the first structure and an additional surface of the second structure that includes the tip, further includes a ramped portion situated between a periphery of the respective surface and the respective tip, wherein portion is capable of contacting the other respective surface.

24. An apparatus for supporting a plurality of components, at least one of which is a heat-generating electrical device, the apparatus comprising:
   a first structure having a first surface on a first side of the structure configured for interfacing a first of the plurality of components and a second surface on a second side of the structure generally opposite the first side;
   a second structure capable of receiving the first structure, wherein one of the second surface of the first structure and an additional surface of the second structure is a conical surface that includes a tip, wherein the tip is in contact with the other of the second and additional surfaces; and
   at least one component configured to assist in retaining the first structure in relation to the second structure, wherein notwithstanding the at least one component the first structure is capable of tilting relative to the second structure about the tip, about an axis aligned with the other of the second and additional surfaces.

25. The apparatus of claim 1, wherein the tilting capability of the first structure relative to the second structure includes tilting in any rotational direction about any axis that is aligned with the other of the second and additional surfaces, up until the one of the second surface of the first structure and an additional surface encounters the other of the second and additional surfaces at one or more locations other than by way of the tip.

26. The method of claim 20, wherein, the at least one heat-generating electronic device is tiltable with respect to the fixed portion about the axis aligned with the fixed portion.

* * * * *

UNITED STATES PATENT AND TRADEMARK OFFICE
CERTIFICATE OF CORRECTION

PATENT NO.        : 7,773,382 B2                                          Page 1 of 1
APPLICATION NO.   : 11/843277
DATED             : August 10, 2010
INVENTOR(S)       : Murray P. Kingston et al.

It is certified that error appears in the above-identified patent and that said Letters Patent is hereby corrected as shown below:

Column 9, line 44: After "disc" and insert --is in contact with the wall structure surface and--
Column 9, line 45: After "conical surface" and insert --,--
Column 10, line 25: After "wherein" and insert --the ramped--

Signed and Sealed this

Sixteenth Day of November, 2010

David J. Kappos
*Director of the United States Patent and Trademark Office*